(12) United States Patent
Yu et al.

(10) Patent No.: US 10,736,235 B2
(45) Date of Patent: Aug. 4, 2020

(54) COOLING MECHANISM OF HIGH MOUNTING FLEXIBILITY

(71) Applicant: ADLINK TECHNOLOGY INC., New Taipei (TW)

(72) Inventors: Hsiu-Ling Yu, New Taipei (TW); Hsuan-Chan Chiang, New Taipei (TW)

(73) Assignee: ADLINK TECHNOLOGY INC., New Taipei (TW)

( * ) Notice: Subject to any disclaimer, the term of this patent is extended or adjusted under 35 U.S.C. 154(b) by 138 days.

(21) Appl. No.: 16/130,312

(22) Filed: Sep. 13, 2018

(65) Prior Publication Data

US 2019/0014689 A1    Jan. 10, 2019

Related U.S. Application Data

(60) Continuation-in-part of application No. 15/493,721, filed on Apr. 21, 2017, now Pat. No. 10,306,805, (Continued)

(51) Int. Cl.
*H05K 7/20* (2006.01)
*F28D 15/02* (2006.01)
(Continued)

(52) U.S. Cl.
CPC ..... *H05K 7/20336* (2013.01); *F28D 15/0233* (2013.01); *F28D 15/0275* (2013.01); *F28F 1/02* (2013.01); *F28F 3/12* (2013.01); *F28F 9/266* (2013.01); *G06F 1/20* (2013.01); *H01L 23/40* (2013.01); *H01L 23/427* (2013.01); *H05K 1/0203* (2013.01); *H05K 7/20436* (2013.01); *H05K 7/20809* (2013.01); *F28F 2255/02* (2013.01); *F28F 2275/08* (2013.01); (Continued)

(58) Field of Classification Search
CPC ............ H05K 7/20336; F28D 15/0233; F28D 15/0275; F28F 1/02; F28F 3/12; F28F 9/266; F28F 2255/02; F28F 2275/08
See application file for complete search history.

(56) References Cited

U.S. PATENT DOCUMENTS

7,382,616 B2 * 6/2008 Stefanoski ............... G06F 1/20
165/104.33
8,004,841 B2 * 8/2011 Cipolla ............... F28D 15/0233
165/104.33
(Continued)

*Primary Examiner* — Jon T. Schermerhorn, Jr.
(74) *Attorney, Agent, or Firm* — Muncy, Geissler, Olds & Lowe, P.C.

(57) ABSTRACT

A cooling mechanism of high mounting flexibility includes a heat sink including a heat sink body defining an accommodation portion and position-limit sliding grooves and stop blocks fastened to the heat sink body, heat pipes positioned in the position-limit sliding grooves and stopped against the stop blocks, each heat pipe having a hot interface accommodated in the accommodation portion and an opposing cold interface positioned in one position-limit sliding groove, heat transfer blocks each defining a recessed insertion passage for accommodating the hot interfaces of the heat pipes and an opposing planar contact surface for the contact of a heat source of an external circuit board, and an elastic member elastically positioned between the heat sink and the heat transfer blocks.

10 Claims, 8 Drawing Sheets

Related U.S. Application Data which is a division of application No. 14/675,059, filed on Mar. 31, 2015, now Pat. No. 10,212,859.

(51) Int. Cl.
*H01L 23/40* (2006.01)
*H05K 1/02* (2006.01)
*F28F 9/26* (2006.01)
*F28F 3/12* (2006.01)
*F28F 1/02* (2006.01)
*G06F 1/20* (2006.01)
*H01L 23/427* (2006.01)

(52) U.S. Cl.
CPC ....... *F28F 2275/14* (2013.01); *F28F 2275/20* (2013.01); *F28F 2280/00* (2013.01)

(56) References Cited

U.S. PATENT DOCUMENTS

| | | | |
|---|---|---|---|
| 9,429,369 B2* | 8/2016 | Wu | F28D 15/0275 |
| 2009/0223647 A1* | 9/2009 | Alousi | F28D 15/0233 165/80.3 |
| 2011/0141692 A1* | 6/2011 | Bult | H05K 7/1404 361/700 |
| 2014/0078673 A1* | 3/2014 | Vincent | H05K 7/20336 361/700 |
| 2015/0062820 A1* | 3/2015 | Lam | H01L 23/473 361/700 |

* cited by examiner

COOLING MECHANISM OF HIGH MOUNTING FLEXIBILITY

CROSS REFERENCE TO RELATED APPLICATIONS

This application is a Continuation-in-Part of co-pending application Ser. No. 15/493,721, filed on Apr. 21, 2017 for which priority is claimed under 35 U.S.C. § 120, which is a Divisional Application of application Ser. No. 14/675,059 filed on Mar. 31, 2015; the entire contents of all of which are hereby incorporated by reference.

BACKGROUND OF THE INVENTION

1. Field of the Invention

The present invention relates to hard disk drive technology and more particularly, to a cooling mechanism of high mounting flexibility, which provides a margin between each heat pipe and each respective position-limit sliding groove that accommodates the respective heat pipe for enabling the hot interfaces of multiple heat pipes to be positioned in one heat transfer block in reversed directions so that the cold interfaces of the heat pipes can be extended to different peripheral sides of the heat sink to enhance the overall heat dissipation efficiency.

2. Description of the Related Art

Following fast development of technology, advanced computers, notebooks and many other electronic products have been continuously created and widely used in every corner of the society. It is the market trend to create electronic products having the characteristics of strong computing capabilities, high operating speed and small size. However, increasing the operating speed of a computer or notebook will lead to an increase in the amount of latent heat produced by the CPU, imaging processor or other active component parts of the motherboard. It is quite important to keep the temperature of the component parts within the optimal range.

It is the normal way to dissipate heat from heat sources of a circuit board by directly attaching a heat sink to the heat sources. Heat sinks with thick cooling fins or different sizes of heat sinks are selectively used to mate with different heat sources having different heights.

However, thick cooling fins have a relatively higher thermal resistance. Taking into consideration the characteristics of low thermal resistance, it needs to use different sizes of heat sinks to mate with different heat sources. This heat transfer medium can be used in a heat sink to reduce thermal resistance.

However, the thickness of the applied heat transfer medium affects the thermal resistance.

Figure 8:
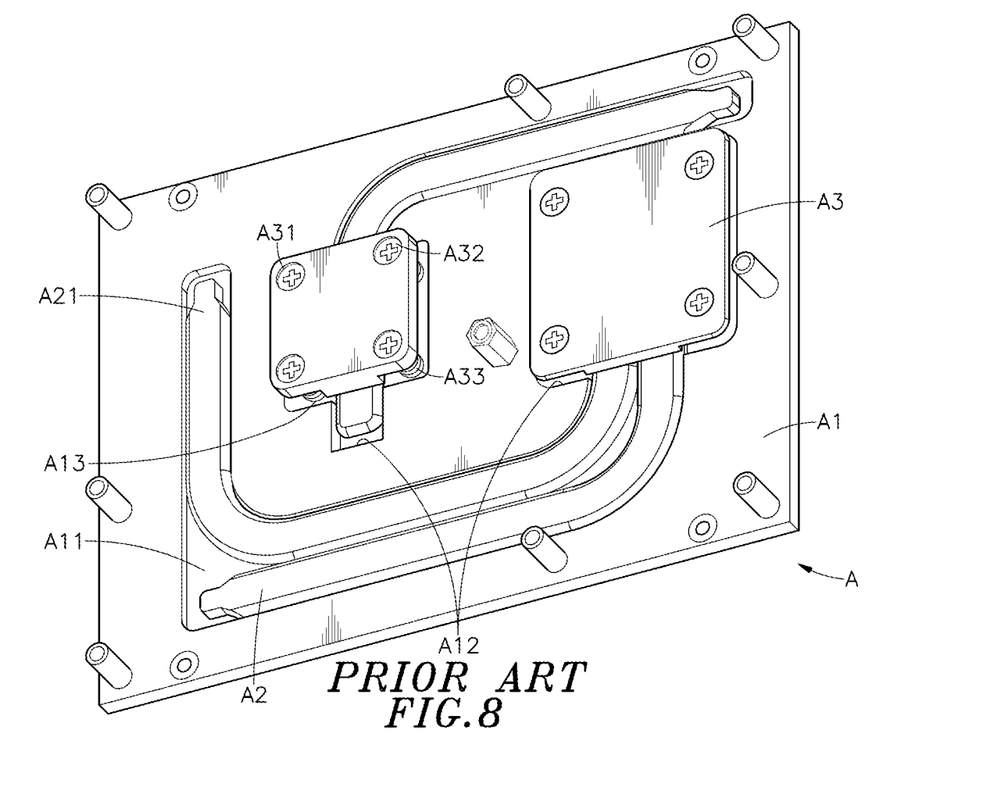
FIG. 8 is an oblique top elevational view of a cooling module according to the prior art.

Cooling modules are then developed to effectively reduce the thermal resistance by means of reducing the thickness of heat transfer medium. A conventional cooling module A, as shown in FIG. 8, comprises a heat sink base A1 which defines a plurality of openings A12, a plurality of locating grooves A11 respectively extended from the openings A12 and a plurality of mounting holes A13 respectively disposed at two opposite sides relative to each opening A12, a plurality of heat pipes A2 respectively accommodated in the locating grooves A11, each heat pipe A2 having one end A21 thereof bonded to one end of one respective locating groove A11 and an opposite end thereof extended to one respective opening A12, a plurality of metal blocks A3 fastened to the heat sink base A1 over the openings A12 and respectively abutted against the respective heat pipes A2, and a plurality of spring members A33 stopped between the heat sink base A1 and the metal blocks A3. Each metal block A3 comprises a plurality of mounting through holes A31, and a plurality of screws A32 respectively inserted through the mounting through holes A31 and the spring members A33 and fastened to the respective mounting holes A13 heat sink base A1. Thus, the metal blocks A3 are flexibly supported on the spring members A33 for abutting against 20 respective heat sources in a circuit board of an electronic apparatus to transfer latent heat from the heat sources to the heat pipes A2 for quick dissipation. Subject to the functioning of the spring members A33, the metal blocks A3 can be kept in tight contact with the respective heat sources, reducing the thermal resistance. However, the arrangement of the spring members A33 between the metal blocks A3 and the heat sink base A1 affects the heat transfer efficiency of transferring latent heat from the heat sources to the heat sink base A1. In this design, the spring members A33 are respectively stopped at the four corners of the metal blocks A3 to keep the metal blocks A3 in balance. However, because each heat pipe A2 has one end A21 thereof bonded to one end of one respective locating groove A11 and an opposite end thereof extended to one respective opening A12, thus, the opposite ends of the heat pipes A2 can simply be arranged in one direction in a parallel manner and bonded to the respective metal blocks A3, i.e., the heat pipes A2 cannot be symmetrically arranged at two opposite sides relative to the metal blocks A3 to let the opposite ends thereof be extended to all different peripheral sides of the heat 10 sink base A1, restricting the use of space and limiting the cooling performance. An improvement in this regard is desired.

SUMMARY OF THE INVENTION

The present invention has been accomplished under the circumstances in view. It is therefore one object of the present invention to provide a cooling mechanism of high mounting flexibility, which comprises a heat sink, at least one heat transfer block and at least one elastic member mounted in the heat sink, and a plurality of heat pipes mounted in the heat sink and oppositely arranged in parallel between the at least one heat transfer block and the at least one elastic member. The heat sink comprises a heat sink body, which comprises an accommodation portion and a plurality of position-limit sliding grooves extended from the the accommodation portion for accommodating the heat pipes respectively, and a plurality of stop blocks fastened to the heat sink body to stop the heat pipes in the position-limit sliding grooves. Each heat pipe comprises a hot interface located at one end thereof and accommodated in one accommodation portion, and a cold interface located at an opposite end thereof and positioned in one position-limit sliding groove. The at least one heat transfer block is mounted in the at least one accommodation portion of the heat sink body, each comprising a recessed insertion passage located in one side thereof for accommodating the hot interface of at least one heat pipe in direct contact and a planar contact surface located at an opposite side thereof for the contact of a heat source of an external circuit board. Thus, the heat pipes and the heat sink are joined together without bonding. Further, the width of the position-limit sliding grooves is larger than the outer diameter of the heat pipes. The margin left between the position-limit sliding grooves and the heat pipes allows transverse displacement of the heat pipes in the respective position-limit sliding grooves without being constrained by the unidirectionally extended heat transfer blocks. In turn, the multiple heat pipes can be properly arranged on the heat sink to maintain a large area for quick spread and distribution of the heat energy, thereby improving the overall heat dissipation efficiency.

Preferably, each elastic member comprises an elastic thermal pad positioned between the bottom surface of the recessed positioning groove and the heat transfer block to provide elastic source means to the respective heat pipes, keeping the respective heat transfer block in positive contact with the heat source. Further, metal sheets are respectively set in between the heat transfer blocks and the elastic thermal pads of the elastic member and fixedly fastened to the respective heat transfer blocks for quick transfer of heat. Thus, the latent heat produced during the operation of the heat sources can be rapidly transferred through the heat transfer blocks to the heat pipes and through the metal sheets and the elastic thermal pads to the heat sink to enhance the overall heat dissipation efficiency.

DETAILED DESCRIPTION OF THE PREFERRED EMBODIMENT

Referring to FIGS. 1-4, a cooling mechanism of high mounting flexibility in accordance with the present invention is shown. The cooling mechanism of high mounting flexibility comprises a heat sink 1, a plurality of heat pipes 2, at least one heat transfer block 3, and at least one elastic member 4.

The heat sink 1 comprises a heat sink body 11, and a plurality of stop blocks 14. The heat sink body 11 comprises an accommodation portion 12 on the surface of the heat sink body 11, at least one opening 121 located in the accommodation portion 12, a plurality of first screw holes 111 spared around the opening 121, a plurality of position-limit sliding grooves 13 outwardly extended from the accommodation portion 12 to the border area thereof for accommodating the heat pipes 2, a plurality of mounting through holes 131 spaced around each position-limit sliding groove 13, and a plurality of internally threaded columns 15 spaced around the position-limit sliding grooves 13. The stop blocks 14 are mounted on the heat sink body 11 and adapted to stop the heat pipes 2 in the position-limit sliding grooves 13. The stop blocks 14 are preferably made in the form of a cooling block, each comprising a plurality of through holes 141 and a screw 142 mounted in each through hole 141.

The heat pipes 2 in this embodiment are flat pipes to achieve a low-profile design, each having a hot interface 21 at a side of the heat pipes 2 for absorbing heat and an opposing cold interface 22 at other side of the heat pipes 2 for discharging heat. In actual application, the shape of the heat pipes 2 can be changed to mate with the structural design of the heat sink 1.

Each heat transfer block 3 comprises at least one, for example, one recessed insertion passage 31 located in a bottom side thereof and having two opposite open ends thereof disposed in a dislocated manner, a positioning structure 32 comprising a plurality of second screw holes 321 spaced around the recessed insertion passage 31 and at least one notch 322 respectively disposed adjacent to one respective second screw hole 321, and a planar contact surface 33 located on an opposing top side thereof.

The elastic member 4 comprises at least one flat-shaped elastic mounting lug 41 and an abutment shrapnel 42. Each elastic mounting lug 41 comprises an elongated position-limit slot 411 located in one end thereof, a circular first through hole 412 located in an opposite end thereof, and two screws 413 respectively inserted through the elongated position-limit slot 411 and the circular first through hole 412 in reversed directions. The abutment shrapnel 42 comprises a plurality of hanging-shaped elastic protruding portion 421, a plurality of circular second through holes 422 spaced around the elastic protruding portions 421, and a screw 423 mounted in each circular second through hole 422.

When assembling the cooling mechanism of high mounting flexibility, put the heat pipes 2 in the respective position-limit sliding grooves 13 in the heat sink body 11 of the heat sink 1 to suspend the hot interfaces 21 of the heat pipes 2 in the opening 121 in the accommodation portion 12 and to keep the respective cold interfaces 22 in the respective position-limit sliding grooves 13, and then place the cooling blocks of the stop blocks 14 on the position-limit sliding grooves 13 over the outer surface of the heat pipes 2, and then thread the screws 142 in the through holes 141 into the respective mounting through holes 131 around the position-limit sliding grooves 13 to affix the stop blocks 14 to the heat sink body 11, holding the heat pipes 2 in the respective position-limit sliding grooves 13. Further, the width of the position-limit sliding grooves 13 is larger than the outer diameter of the heat pipes 2, providing a margin.

Thereafter, aim the elongated position-limit slots 411 of the elastic mounting lugs 41 of the elastic member 4 at the respective first screw holes 111 of the heat sink body 11, and then thread the respective screws 413 in the elongated position-limit slots 411 into the respective first screw holes 111, and then place the heat transfer block 3 in the opening 121 in the accommodation portion 12 to abut the recessed insertion passage 31 against the hot interfaces 21 of the heat pipes 2 and insert the elastic mounting lug 41 into the notch 322 of the positioning structure 32 and then thread the screw 413 in the circular first through hole 412 into one respective second screw hole 321 of the positioning structure 32 to affix the elastic mounting lug 41 to the heat transfer block 3, and then insert the abutment shrapnel 42 of the elastic member 4 into the opening 121 in the accommodation portion 12 of the heat sink body 11 to abut the elastic protruding portions 421 of the abutment shrapnel 42 against the outer surface of the heat pipes 2, and then thread the screws 423 in the respective circular second through holes 422 into respective second screw holes 321 of the positioning structure 32. Thus, the heat transfer block 3, the elastic member 4 and the heat sink body 11 are fixedly fastened together, securing the hot interfaces 21 of the heat pipes 2 in the recessed insertion passage 31 between the abutment shrapnel 42 and the heat transfer block 3. By means of adjusting the threaded depth of the screws 423 in the respective second screw holes 321, the pressure of the elastic protruding portions 421 being acted on the heat pipes 2 is relatively adjusted, keeping the heat pipes 2 and the heat transfer blocks 3 in a tight contact relationship, and thus, the cooling mechanism of high mounting flexibility is well assembled. The heat sink 1 can be made from aluminum or copper.

Further, the heat pipes 2 can be kept in direct contact with the surfaces of the position-limit sliding grooves 13 of the heat sink 1, or, a thermal paste can be applied to the surface area between the heat pipes 2 and the position-limit sliding grooves 13 of the heat sink 1. Further, the heat transfer block 3 is preferably made from copper. A thermal paste can be applied to the surface area between the recessed insertion passage 31 of the heat transfer block 3 and the heat pipe 2 to fill up the designed-in clearance between the heat pipes 2 and the heat sink 1 or heat transfer block 3 and the gaps in rough, uneven surfaces.

The cooling mechanism of high mounting flexibility can be used to dissipate heat from each heat source (not shown) such as CPU, GMCH (Graphics and Memory Controller Hub) chip, ICH (I/O Controller Hub) chip or RAM (Random Access Memory) chip in a circuit board (such as motherboard, interface card) of a computer, notebook, server, embedded system or other computer equipment. In application, attach the planar contact surface 33 of each heat transfer block 3 to one respective heat source in the circuit board, and then mount screws in the circuit board and thread these screws into the respective internally threaded columns 15 of the heat sink 1 to affix cooling mechanism of high mounting flexibility to the circuit board of the computer, notebook, server, embedded system or other computer equipment. Further, in installation, a thermal paste can be applied to the surface area between the planar contact surface 33 of each heat transfer block 3 and each respective heat source in the circuit board of the computer, notebook, server, embedded system or other computer equipment.

When abutting each heat transfer block 3 against one respective heat source of the circuit board of the computer, notebook, server, embedded system or other computer equipment, each heat transfer block 3 is forced to move vertically in direction toward the inner side of the accommodation portion 12 of the heat sink 1 to move the hot interface 21 of the heat pipe 2 so that the cold interface 22 is stopped at the stop block 14 to work as a fulcrum for cooperation with the elastic material property, forming floating state. The positioning of the screw 413 in the elongated position-limit slots 411 of the elastic mounting lugs 41 of the elastic member 4 and the first screw hole 111 of heat sink 1 works as a fulcrum to support the heat transfer blocks 3 so that the heat transfer blocks 3 can be flexibly stopped against the surface of the heat source to keep the pressure in balance, keeping the respective heat transfer blocks 3 in positive contact with the respective heat source to effectively reduce the thermal resistance.

During operation of each source of the circuit board of the computer, notebook, server, embedded system, or other computer equipment, each respective aluminum or copper heat transfer block 3 absorbs latent heat from the respective heat source and transfers absorbed latent heat to the hot interface 21 of the respective heat pipe 2 directly or through the applied thermal paste, enabling the internal working fluid of each heat pipe 2 to repeatedly cycle phase transition between the hot interface 21 and the cold interface 22 thereof through a capillary action or gravity. Further, the stop blocks 14 (for example, cooling blocks) and the aluminum or copper heat sink 1 provide a large area of heat dissipation surface to facilitate rapid and efficient dissipation of latent heat from each heat source of the circuit board of the computer, notebook, server, embedded system or other computer equipment, maintaining normal system functioning.

Figure 1:
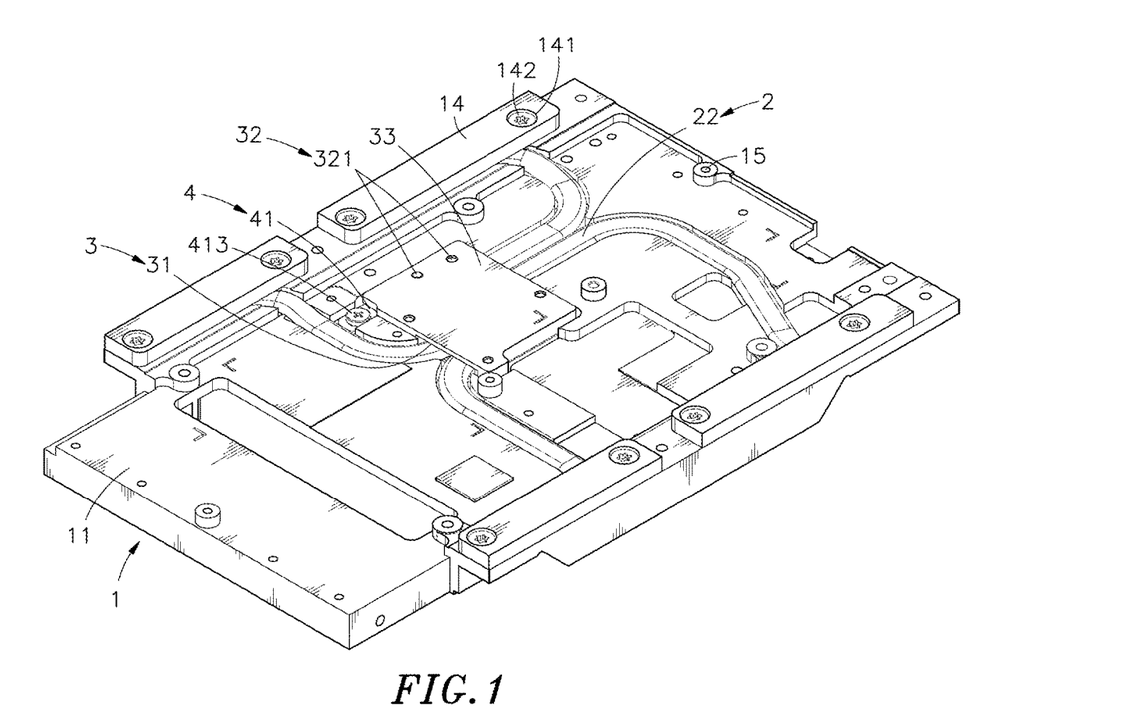
FIG. 1 is an oblique top elevational view of a cooling mechanism of high mounting flexibility in accordance with the present invention.
Figure 2:
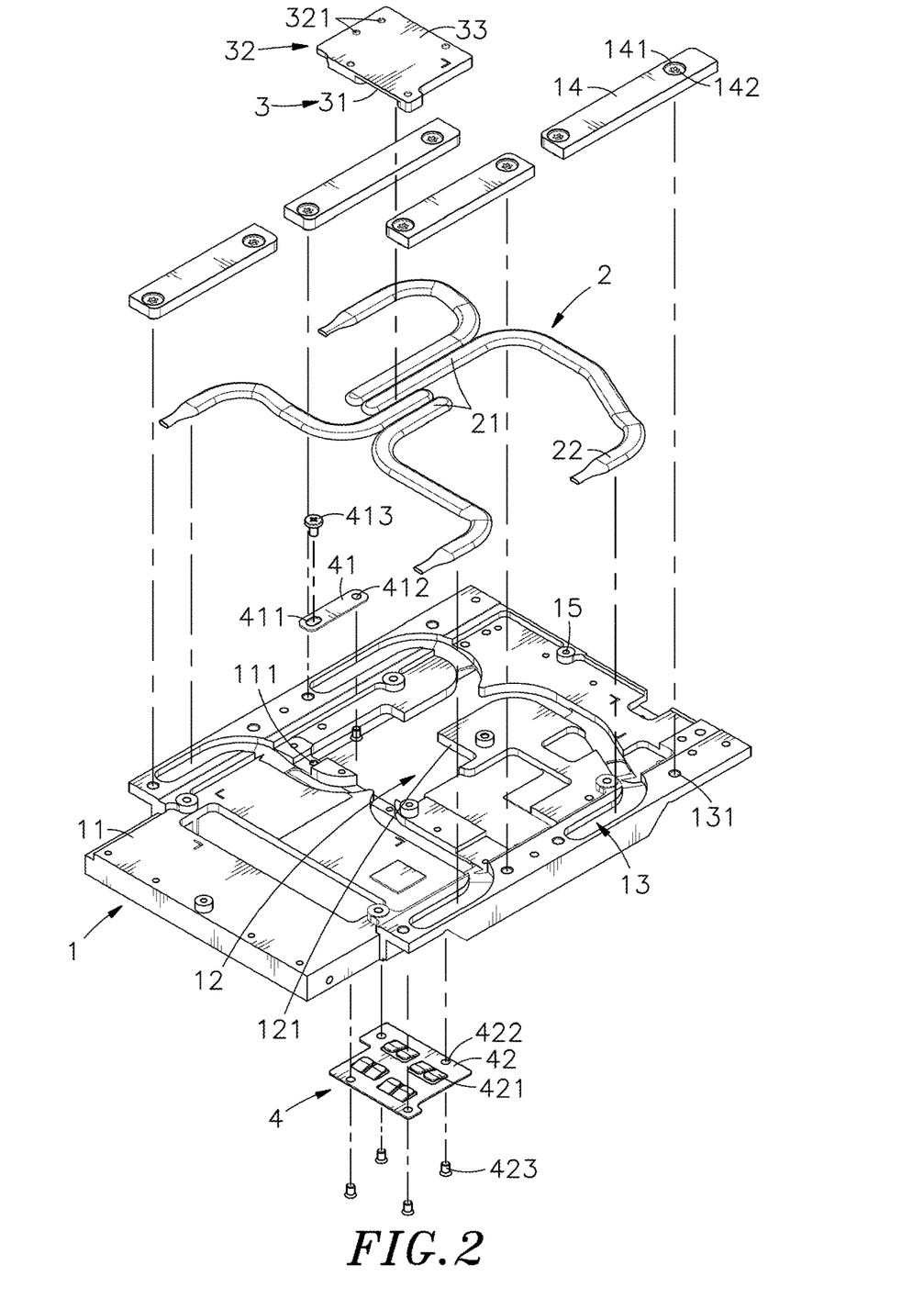
FIG. 2 is an exploded view of the cooling mechanism of high mounting flexibility in accordance with the present invention.
Figure 3:
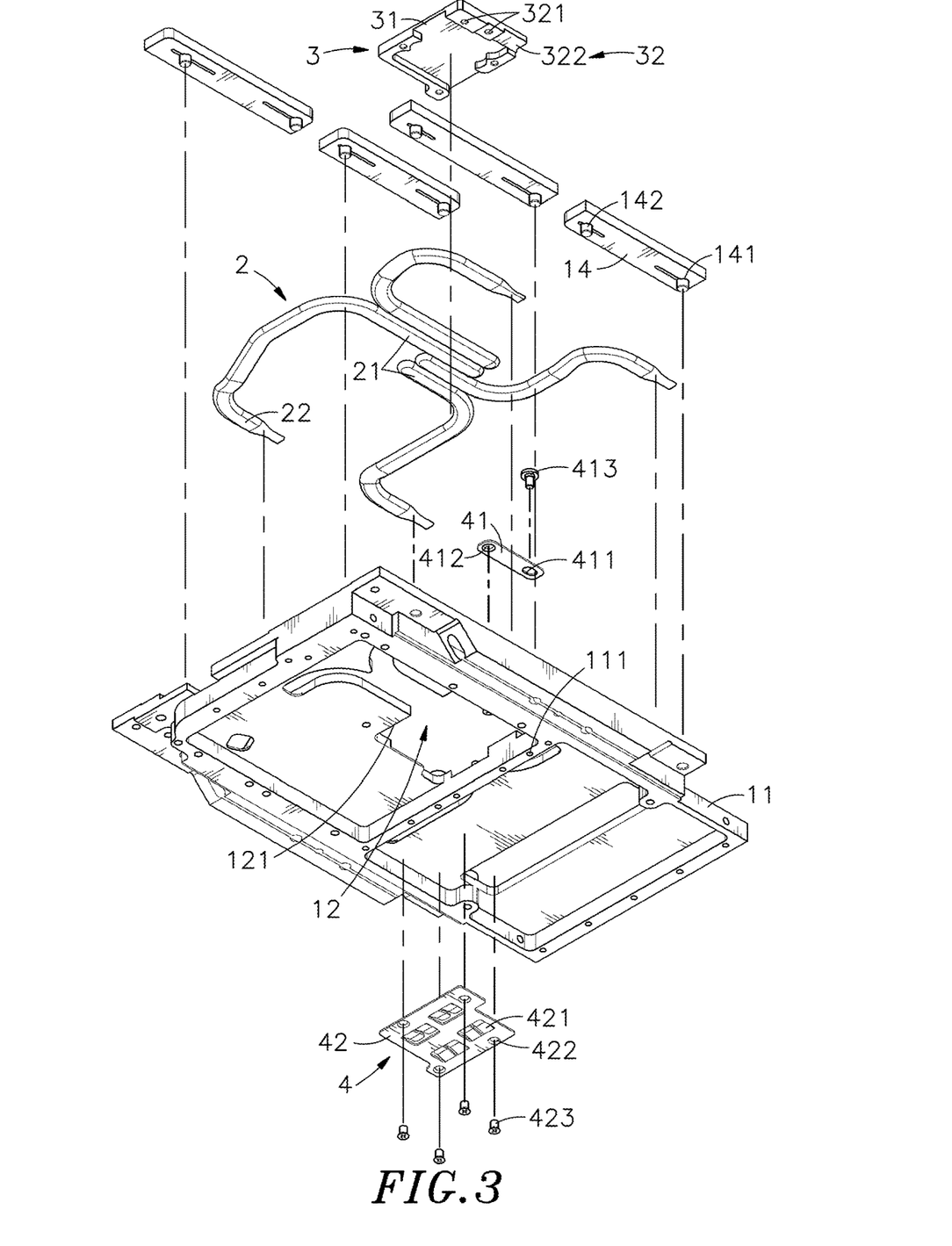
FIG. 3 corresponds to FIG. 2 when viewed in another angle.
Figure 4:
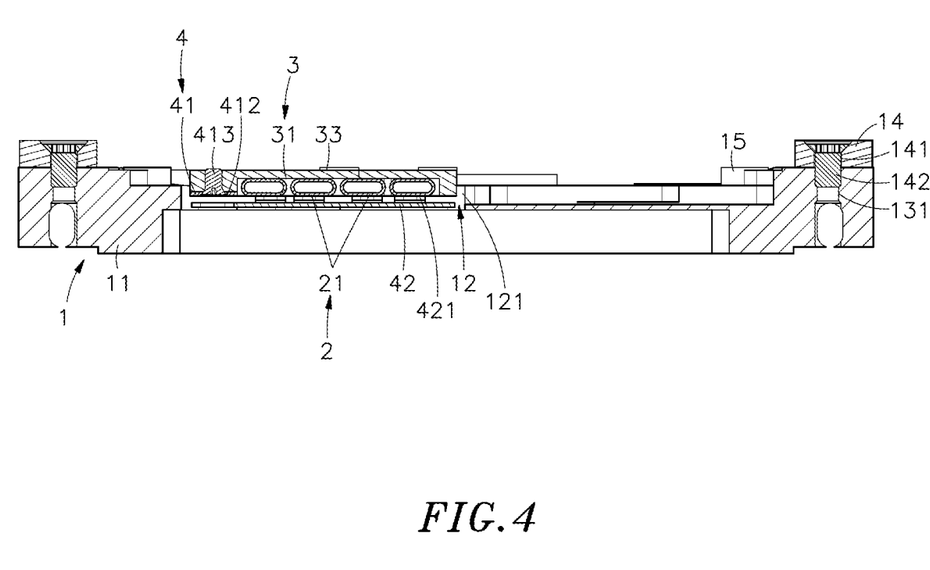
FIG. 4 is a sectional side view of the cooling mechanism of high mounting flexibility in accordance with the present invention.
Figure 5:
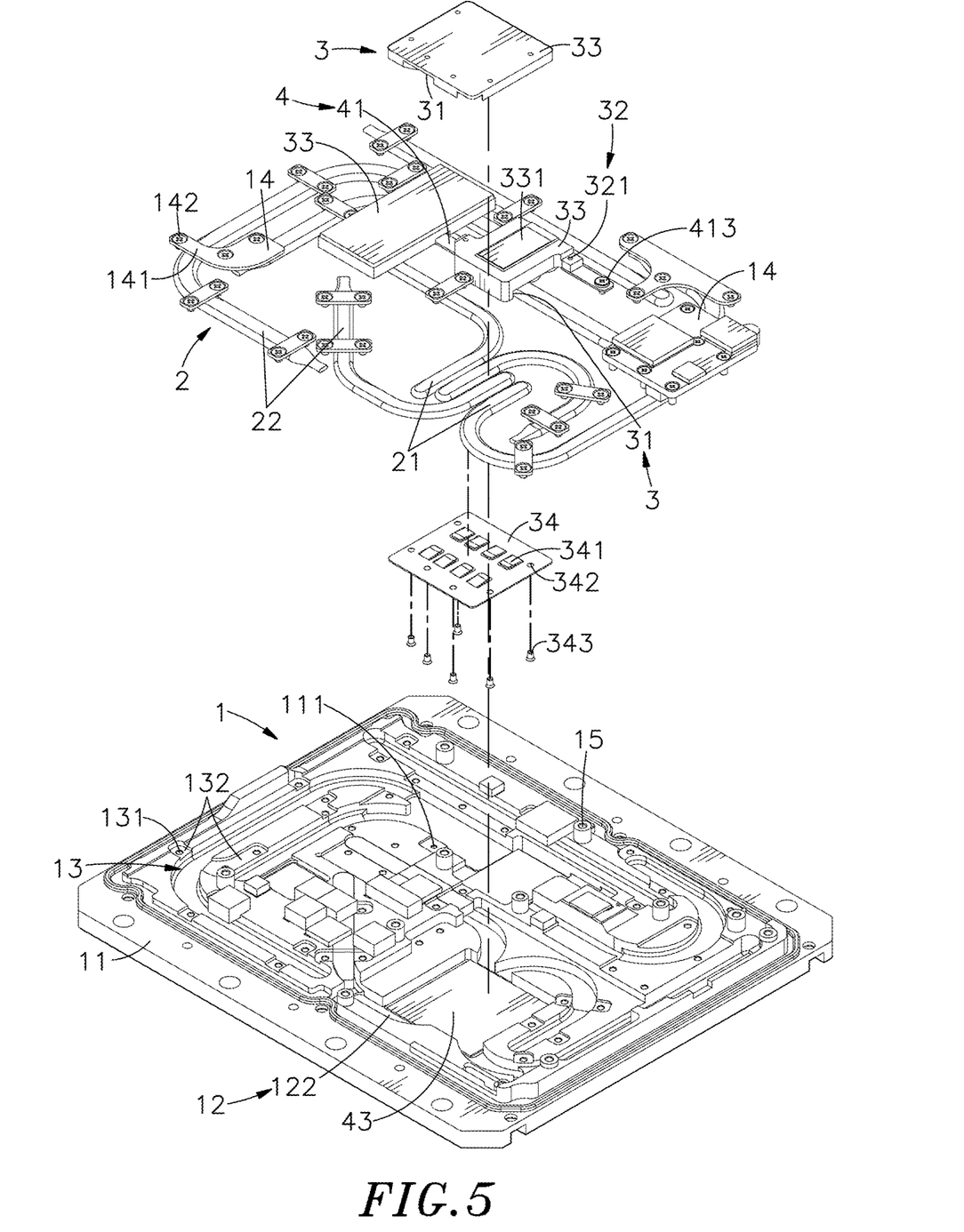
FIG. 5 is an exploded view of an alternate form of the cooling mechanism of high mounting flexibility in accordance with the present invention.
Figure 6:
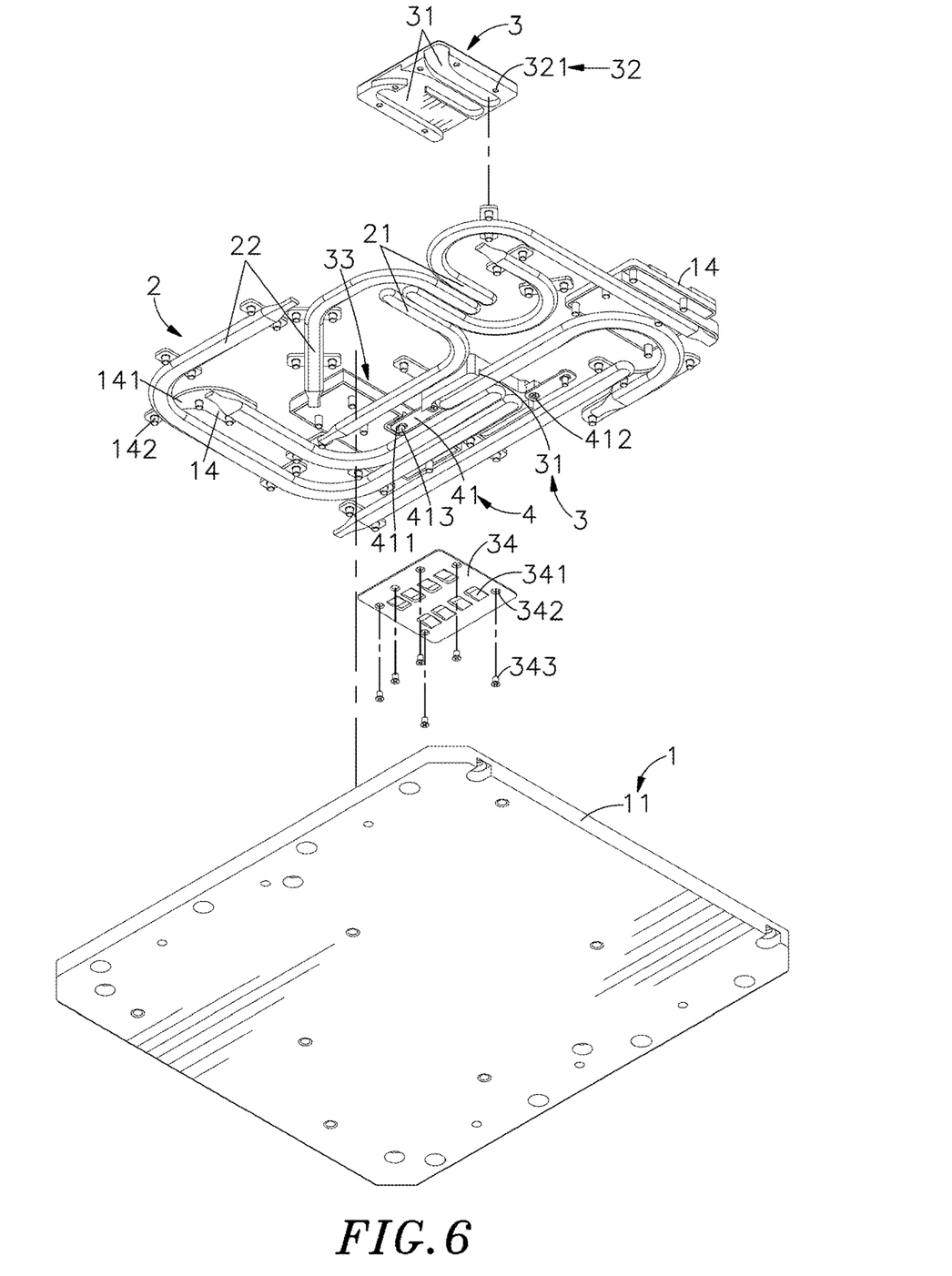
FIG. 6 corresponds to FIG. 5 when viewed in another angle.
Figure 7:
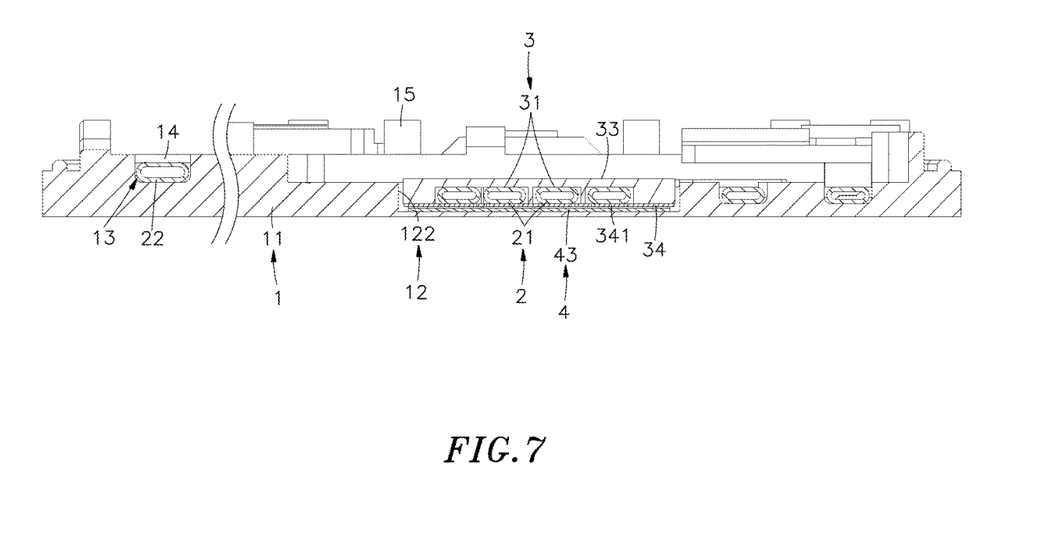
FIG. 7 is a sectional front view of the alternate form of the cooling mechanism of high mounting flexibility in accordance with the present invention.

Referring to FIGS. 5-7, an exploded top elevational view of an alternate form of the present invention, an exploded bottom elevational vies of the alternate form of the present invention and a sectional front view of the alternate form of the present invention are shown. This alternate form is substantially similar to the aforesaid embodiment shown in FIGS. 1-4 with the exceptions outlined hereinafter. In an alternate form of the present invention, a recessed positioning groove 122 is defined in the accommodation portion 12; the elastic members 4 each further comprise an elastic thermal pad 43 respectively positioned in the bottom surface of the recessed positioning groove 122; each heat transfer block 3 comprises at least one, for example, one recessed insertion passage 31 located in a bottom side thereof and having the positioning structure 32 comprising a plurality of second screw holes 321 spaced around the recessed insertion passage 31; metal sheets 34 is covered over the recessed insertion passage 31 of a side of the heat transfer block 3, the metal sheets 34, for example, aluminum or copper sheets, the metal sheets 34 comprising a plurality of hanging-shaped elastic protruding portions 341 arranged side by side, a plurality of through holes 342 spaced around the elastic protruding portions 341, and screws 343 respectively mounted in the through holes 342.

When assembling this alternate form of the cooling mechanism of high mounting flexibility, insert the hot interfaces 21 of the heat pipes 2 into the recessed insertion passages 31 of the heat transfer blocks 3 arranged side by side, the heat pipes 2 to be flexibly and respectively supported on the elastic protruding portions 341 of the metal sheets 34. Then, thread the screws 343 into the respective second screw holes 321 of the positioning structure 32 to affix the metal sheets 34 to the heat transfer blocks 3, thus, position-limit spaces are respectively defined between the metal sheets 34 and the recessed insertion passages 31 of the heat transfer blocks 3 for the heat pipes 2. At this time, the elastic protruding portions 341 of the metal sheets 34 impart a pressure to the outer surface of the hot interfaces 21, keeping the heat pipes 2 in positive contact with the bottom surfaces of the recessed insertion passages 31 of the heat transfer blocks 3. This arrangement greatly increases the overall heat transfer surface area. Further, a thermal grease can be applied between the metal sheets 34 and the heat pipes 2 to fill up any gap or uneven surface between the metal sheets 34 and the heat pipes 2, effectively minimizing thermal resistance.

In this alternate form, the hot interface 21 of a side of each heat pipe 2 can be inserted into the accommodation portion 12 of the heat sink 1 and the recessed insertion passage 31 of the heat transfer block 3; the mounting lugs 41 of the elastic member 4 around the accommodation portion 12 elastically support the heat transfer block 3 so that the pressure of the heat transfer block 3 that elastically abuts against the surface of the heat source reaches an equilibrium state. The hot interface 21 of the opposite heat pipe 2 is positioned in the recessed insertion passage 31 of another heat transfer block 3 so that are arranged side by side. The elastic protruding portion 341 of the metal sheet 34 imparts a pressure respectively to the hot interface 21, holding the hot interface 21 in positive contact with the bottom surface of the recessed insertion passage 31. Thus, another heat transfer block 3 with the heat pipe 2 can be accommodated in the recessed positioning groove 122 of the accommodation portion 12 where the structural design of the recessed positioning groove 122 provide a space for vertical displacement of the heat transfer block 3, and thus, the hot interface 21 of the heat pipe 2 is floatable. Further, the elastic thermal pad 43 in the recessed positioning groove 122 is elastically kept in contact with the metal sheet 34 for transferring heat energy directly so that the heat energy generated during the operation of the heat source can be directly transferred by the heat transfer block 3 to the hot interface 21 of a side of heat pipe 2 in a two-dimensional planar heat conduction manner, and at the same time, the cold interface 22 transfer heat to the heat sink 1 for rapid spreading and distribution. At the same time, heat energy can be transferred through the metal sheets 34 and the elastic thermal pads 43 along the normal lines to the outer surface of the heat sink 1, reducing the overall thermal diffusion gradient and enhancing the overall heat dissipation efficiency.

Further, in this alternate form of the present invention, at least one heat transfer medium 331 (such as cooling fin or thermal grease) is mounted on or applied to the planar contact surface 33 of the heat transfer block 3 to effectively reduce the thermal resistance between each heat source and the respective heat transfer block 3. Further, the elastic thermal pad 43 is set between the bottom surface of the recessed positioning groove 122 of the heat sink 1 and the heat transfer block 3. The elastic thermal pad 43 is selectively made from silicone rubber, rubber, or a polymer material mixed with a heat conductive material powder selected from the group consisting of ceramics, graphite, alumina and silver. The elastic thermal pads 43 fill up the designed-in clearance between the bottom surface of the recessed positioning grooves 122 and the heat transfer blocks 3 and the gaps in rough, uneven surfaces. When the heat transfer blocks 3 are abutted against respective heat sources, the elastic thermal pads 43 provide an elastic supporting force to the heat transfer blocks 3 against the heat sources, keeping the heat transfer blocks 3 in positive contact with the respective heat sources and minimizing the thermal resistance therebetween.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A cooling mechanism of high mounting flexibility, comprising a heat sink, at least one heat transfer block, at least one elastic member and a plurality of heat pipes, wherein:

said heat sink comprises a heat sink body, a recessed positioning groove of at least one accommodation portion disposed on said heat sink body, a plurality of position-limit sliding grooves located on the periphery of said accommodation portion and extending outward for the abutment of said heat pipes, and a plurality of stop blocks joined to said position-limit grooves and stopped against outer surfaces of said heat pipes;

said heat pipes are joined to said heat sink with respective hot interfaces thereof oppositely inserted into said accommodation portion and arranged in parallel and respective opposite cold interfaces thereof respectively positioned in said position-limit sliding grooves;

said heat transfer block is mounted in said accommodation portion of said heat sink body, said heat transfer block comprising at least one recessed insertion passage located in one side thereof and extended to the border thereof for accommodating the hot interface of said heat pipe in a floatable manner, a metal sheet fastened to the one side and defining with said recessed insertion passage a position-limit space for limiting the floating of the said heat pipe, and a planar contact surface located at an opposite side thereof for the contact of a heat source of an external circuit board;

said elastic member comprising an elastic thermal pad positioned in bottom surface of said recessed positioning groove of said heat sink body and elastically disposed in contact with one said metal sheet.

2. The cooling mechanism of high mounting flexibility as claimed in claim 1, wherein the width of said position-limit sliding grooves of said heat sink is larger than the outer diameter of said heat pipes, providing a predetermined margin for allowing transverse displacement of each said heat pipe in the respective position-limit sliding groove.

3. The cooling mechanism of high mounting flexibility as claimed in claim 1, wherein said heat sink further comprises a plurality of mounting through holes spaced around said position-limit grooves; said stop block comprises a plurality of through holes fastened to respective said mounting through holes of said heat sink body of said heat sink by respective screws so that said heat pipes are stopped at said stop blocks and prohibited from moving away from said screws outside said position-limiting sliding grooves.

4. The cooling mechanism of high mounting flexibility as claimed in claim 3, wherein said heat sink further comprises a plurality of locating grooves respectively extended from said position-limit sliding grooves spaced around said mounting through holes; said stop blocks are respectively fitted into said locating grooves.

5. The cooling mechanism of high mounting flexibility as claimed in claim 1, wherein said metal sheet is covered over said recessed insertion passage of said heat transfer block, comprising rows of a plurality of hanging-shaped elastic protruding portions abutted against at least one said heat pipe, and impart a pressure to said heat pipe in positive contact with a bottom surface of said recessed insertion passage.

6. The cooling mechanism of high mounting flexibility as claimed in claim 1, wherein said heat transfer block further comprises a positioning structure, said positioning structure comprising a plurality of second screw holes spaced around said recessed insertion passage; said metal sheet comprises a plurality of through holes spaced around said elastic protruding portions and respectively fastened to the said second screw holes by respective screws.

7. The cooling mechanism of high mounting flexibility as claimed in claim 1, wherein said heat sink is selectively made from aluminum or copper.

8. The cooling mechanism of high mounting flexibility as claimed in claim 1, wherein said heat transfer block is selectively made from aluminum or copper.

9. The cooling mechanism of high mounting flexibility as claimed in claim 1, wherein metal sheet is selectively made from aluminum or copper.

10. The cooling mechanism of high mounting flexibility as claimed in claim 1, wherein said elastic thermal pad is selectively made from silicone rubber, rubber, or a polymer material mixed with a heat conductive material powder selected from the group consisting of ceramics, graphite, alumina and silver.

\* \* \* \* \*